United States Patent [19]

Miyawaki et al.

[11] Patent Number: 4,970,727
[45] Date of Patent: Nov. 13, 1990

[54] SEMICONDUCTOR INTEGRATED CIRCUIT HAVING MULTIPLE SELF-TEST FUNCTIONS AND OPERATING METHOD THEREFOR

[75] Inventors: Yoshikazu Miyawaki; Masanori Hayashikoshi; Takeshi Nakayama; Kazuo Kobayashi; Yasushi Terada, all of Hyogo, Japan

[73] Assignee: Mitsubishi Denki Kabushiki Kaisha, Tokyo, Japan

[21] Appl. No.: 263,118

[22] Filed: Oct. 27, 1988

[30] Foreign Application Priority Data

Nov. 17, 1987 [JP] Japan .................. 62-291335

[51] Int. Cl.$^5$ .................................................. G06F 11/00
[52] U.S. Cl. ........................................ 371/21.3; 371/21.4
[58] Field of Search ................... 371/21.3, 21.4, 21.1, 371/22.6, 22.5, 22.1, 22.2, 15.1; 365/201; 324/73 R, 73 AT

[56] References Cited

U.S. PATENT DOCUMENTS

| | | | |
|---|---|---|---|
| 3,655,959 | 4/1972 | Chernow | 371/21.1 |
| 4,622,668 | 11/1986 | Dancker | 371/21.1 X |
| 4,654,849 | 3/1987 | White | 371/21.3 X |
| 4,841,233 | 6/1989 | Yoshida | 365/201 X |

FOREIGN PATENT DOCUMENTS 65444 4/1984 Japan .................. 324/73 R

OTHER PUBLICATIONS

ISSCC 83: "A Sub 100 ns Static 64K CMOS EPROM with On-Chip Test Functions", by M. W. Kneeht et al., Session IV, Feb. 23, 1982, p. 62.
IEEE J. of Sol. St. Circuits: "A 1-Mbit CMOS Dynamic RAM with Design-For Test Functions", by H. McAdams et al., vol. SC-21, No. 5, Oct. 1986, pp. 635-642.

Primary Examiner—Jerry Smith
Assistant Examiner—Robert W. Beausoliel
Attorney, Agent, or Firm—Lowe, Price, LeBlanc, Becker & Shur

[57] ABSTRACT

In a semiconductor integrated circuit such as a semiconductor memory device capable of operating in a special mode in addition to a standard operation mode, a high voltage detection circuit 10 detects a high voltage applied to one of control signal input terminals CS and outputs a detection signal HV to a special mode circuit 14. The special mode circuit 14 outputs a switch signal CO to a switching circuit 11 in response to the detection signal HV. The switching circuit 11 connects an input-/output buffer 7 to a latch circuit 12 in response to the switch signal CO. A special mode code MC is applied to input/output terminals DT and transmitted to the latch circuit 12 through the switching circuit 11. A special mode decoder 13 decodes the special mode code MC which has been latched by the latch circuit 12 and outputs a signal for specifying the special mode to a control circuit 8. Operation in the special mode specified by the control circuit 8 is executed. By detecting a confirmation signal CS applied to one of the control signal input terminals CS during the execution of the special mode, the special mode code MC which has been already latched by the latch circuit 12 can be outputted from the input/output terminals DT.

8 Claims, 7 Drawing Sheets

FIG. 8A
DESIGNATION OF SPECIAL MODE

FIG. 8B
CONFIRMATION OF SPECIAL MODE

SEMICONDUCTOR INTEGRATED CIRCUIT HAVING MULTIPLE SELF-TEST FUNCTIONS AND OPERATING METHOD THEREFOR

BACKGROUND OF THE INVENTION

1. Field of the Invention

The present invention relates generally to an on-chip testing integrated circuit and a method for testing semiconductor memory or other integrated circuits in several multiple testing modes.

2. Description of the Prior Art

Figure 1:
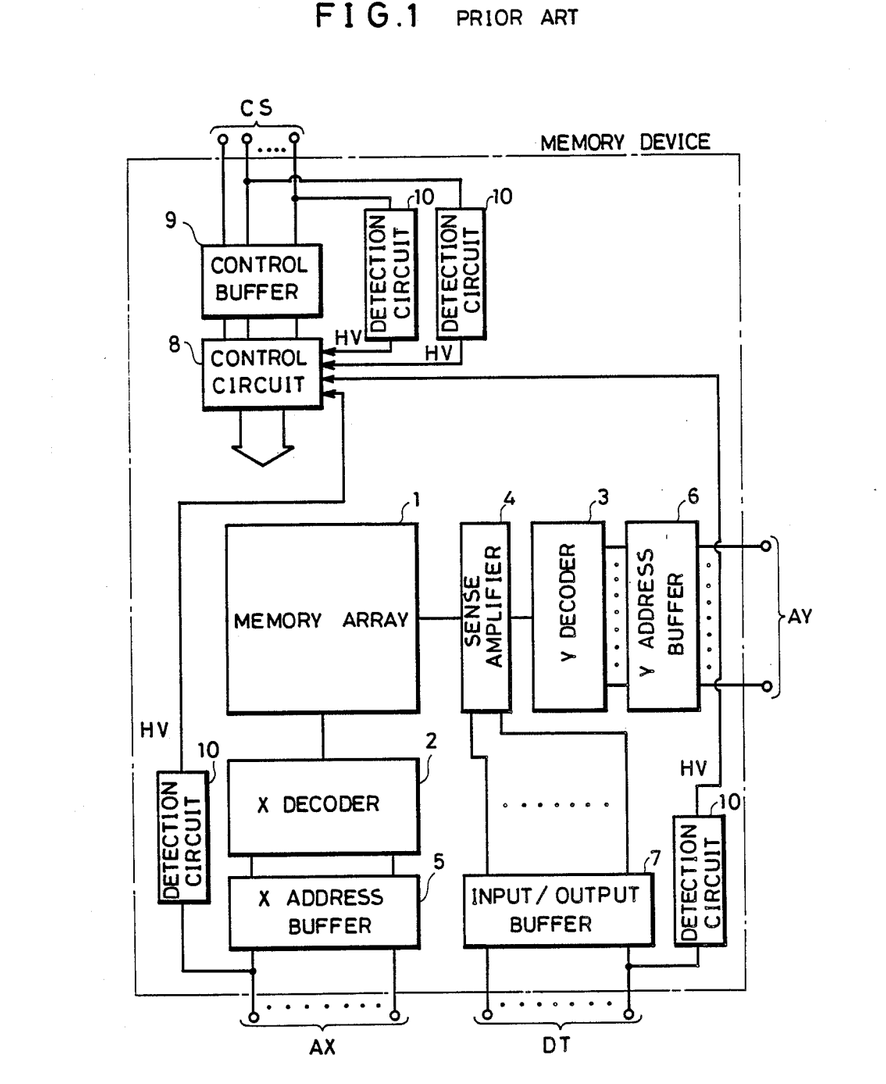
FIG. 1 is a block diagram showing one example of a configuration of a conventional semiconductor memory device.

FIG. 1 is a block diagram showing an outline of a configuration of a conventional semiconductor memory device capable of performing reading and writing data. Main components of this device and operation thereof are described in brief in the following.

In a standard reading/writing operation mode, an X address buffer 5 receives an X address signal applied to X address input terminals AX and applies it to an X decoder 2. A Y address buffer 6 receives a Y address signal applied to Y address input terminals AY and applies it to a Y decoder 3. In writing operation, input data applied to data input/output terminals DT is applied to a memory cell in a memory array 1 specified by the X decoder 2 and the Y decoder 3, through an input/output buffer 7 and a sense amplifier 4. On the other hand, in reading operation, data is read by the sense amplifier 4 from a memory cell in the memory array 1 specified by the X decoder 2 and the Y decoder 3 and is outputted from the data input/output terminals DT through the input/output buffer 7. A control circuit 8 receives a control signal applied from control signal input terminals CS through a control buffer 9 and applies the control signal to each component to perform the above described operation.

In addition to the above described standard operation mode, the semiconductor memory device is sometimes operated under certain special modes. The special modes are set, for example, in such cases as a reliability evaluation test at the time of shipment from a factory, a partial performance test of a circuit in a shortened operating time and a reading of chip identifying information.

For example, in a case of EEPROM (Electrically Erasable and Programmable Read only Memory), there are various special modes, as shown in a following Table 1. In the Table 1, approximate time required for executing an each special mode is described.

TABLE 1

| | Special Mode (EEPROM) | Required Time |
|---|---|---|
| 1. | Evaluation test of the number of times of rewriting (Automatic E/W) | several hours ~dozens of days |
| 2. | Evaluation test of memory holding (Automatic High Temperature Test) | several hours ~dozens of days |
| 3. | Short test | ~1 μsec |
| 4. | Silicon signature { Writing / Reading } | ~1 μsec |
| 5. | E.E.C. { Correction circuit cut / Syndrome external output / Parity bit external output } | ~1 μsec |
| 6. | Check on an amount of shifts of a threshold voltage in a memory cell transistor | ~1 μsec |
| 7. | Evaluation test of resistance of a memory cell | several hours ~several days |
| 8. | Simplified final test | — |
| 9. | Chip erase test | — |

In the EEPROM, the evaluation test of the number of rewriting and the evaluation test of memory holding are especially important among the special modes shown in the Table 1, and thus it takes time to perform those tests.

In addition, in a paper published by H. McAdams, et al., and will be described later, examples of special modes with respect to dynamic RAM are seen, and which are shown in a following table 2.

TABLE 2

| Special modes (dynamic RAM) |
|---|
| 1. 8 BIT PARALLEL READ & WRITE |
| 2. STATIC REFRESH DISTURB |
| 3. FIELD LEAKAGE (STATIC) |
| 4. FIELD LEAKAGE (DYNAMIC) |
| 5. EXTERNAL SENSE AMP TIMING |
| 6. REDUNDANCY ROLL CALL |
| 7. SENSE AMP MARGIN |
| 8. RESET TO MEMORY MODE |
| 9. EXTERNAL OSC. TO VBB PUMP |
| 10. OVERVOLTAGE DETECTOR TEST |

As an further example of such special modes is described in a paper "A Sub 100ns Static 64K CMOS EPROM With On-Chip Test Functions" presented by M.W. Kneeht et al., in ISSC (International Solid-State Circuits Conference) of IEEE held Feb. 23, 1983.

In order to designate such a special mode, conventionally, a method is employed, in which a plurality of optional external terminals including an address input terminal, a data input/output terminal, a control signal input terminal and the like are connected with a plurality of high voltage detection circuits and a high voltage is applied to any of the terminals to designate a special mode corresponding to the terminal concerned.

Referring to FIG. 1, four high voltage detection circuits 10 are connected to the X address input terminals AX, the data input/output terminals DT and the control signal input terminals CS and when any of the circuits detects a high voltage, a high voltage detection signal HV is applied to the control circuit 8. The control circuit 8 receives the high voltage detection signal HV and performs a control operation to carry out the corresponding special mode.

Figure 2:
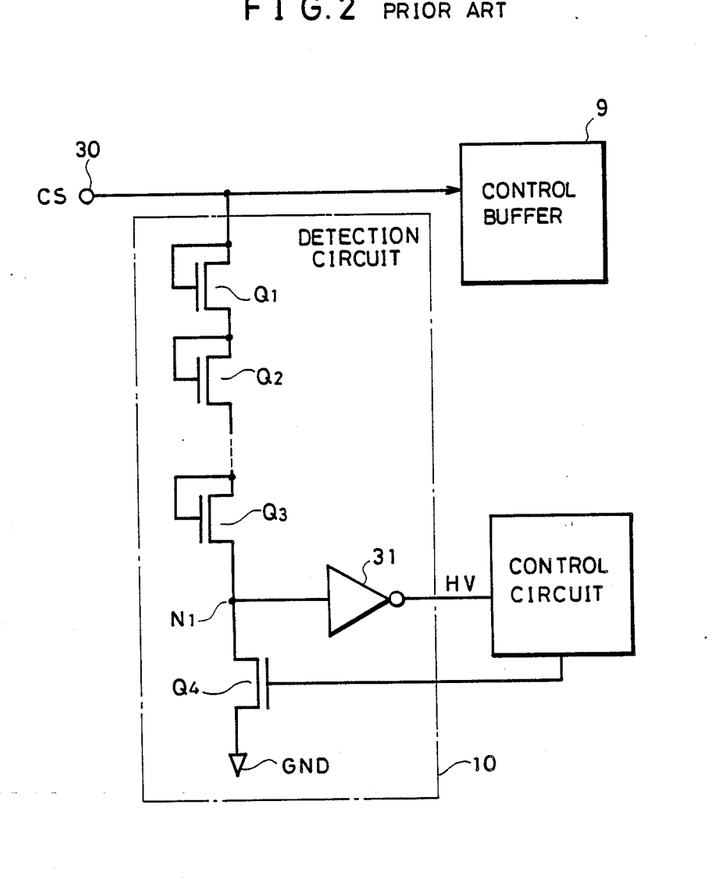
FIG. 2 is a schematic diagram showing one example of a conventional high voltage detection circuit.

FIG. 2 is a schematic diagram showing one example of a conventional high voltage detection circuit. This high voltage detection circuit is shown as being connected to the control signal input terminal CS shown in FIG. 1 and it comprises a plurality of n channel MOS transistors Q1 to Q4 connected in series between one terminal 30 of the control signal input terminals CS and the ground GND, as well as an inverter 31. Only three transistors Q1 to Q3 are shown in the figure but, in effect, three or more transistors are connected. The transistors Q1 to Q3 have the gates connected to the respective drains, whereby diodes are formed. The transistor Q4 has its gate connected to the control circuit 8 and a reset signal is applied from the control circuit 8 at the time of resetting. The inverter 31 is connected to a connection point N1 between the transistors Q3 and Q4 and its output signal, that is, the high voltage detection signal HV is applied to the control circuit 8.

Now, operation of the high voltage detection circuit thus constructed is described.

When a high voltage is applied to the terminal 30 and a voltage of the connection point N1 exceeds a threshold of the inverter 31, the output signal, that is, the high voltage detection signal HV of the inverter 31 changes to a low level from a high level. When the supply voltage is DC 5V, the level of this high voltage is, for example, approximately 9V. The control circuit 8 receives the high voltage detection signal HV of the low level and recognizes that the special mode predetermined in correspondence with this terminal 30 is designated. Since it is necessary to continuously apply the high voltage detection signal HV to the control circuit 8 during operation of the special mode, it is necessary to continue to apply the high voltage to the terminal 30.

Figure 3:
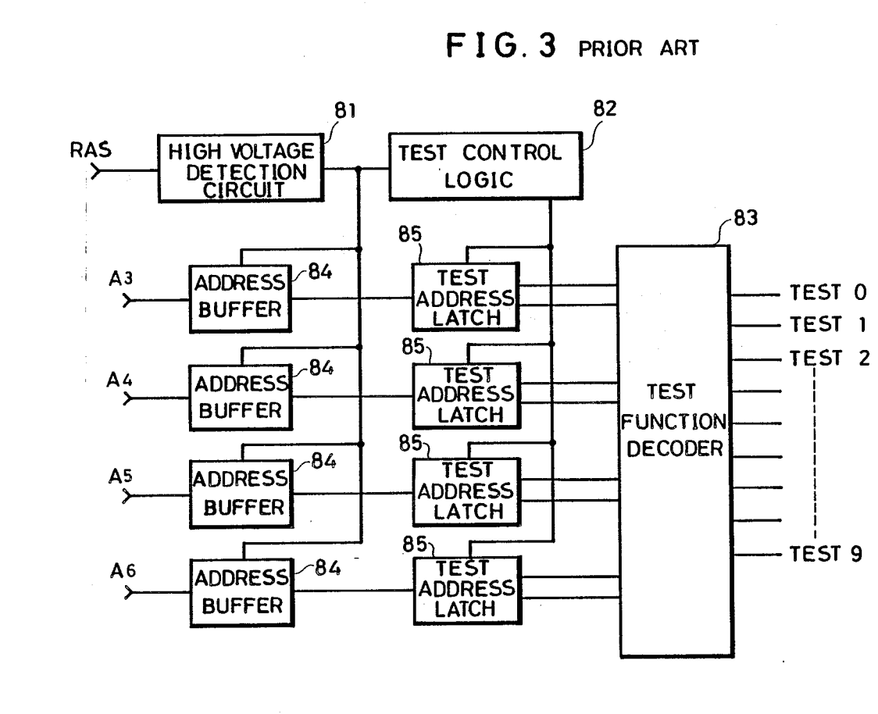
FIG. 3 is a block diagram showing a configuration for performing the test function of the 1-M bit dynamic RAM disclosed in the prior art document published in Oct., 1986.

FIG. 3 is a block diagram for explaining a test function of a 1-M bit dynamic RAM described in a paper "A 1-M Bit CMOS Dynamic RAM With Design-For Test Functions" by H. McAdams et al., in IEEE Journal of Solid-State Circuits (Vol. Sc. 21), Oct., 1986.

Referring to FIG. 3, an $\overline{RAS}$ signal terminal RAS is connected to an input of a high voltage detection circuit 81 and a test control logic 82 is connected to an output of the high voltage detection circuit 81. Address input terminals A3 to A6 are connected to address buffers 84, respectively and the address buffers 84 are connected to test address latches 85, respectively. Test address latches 85 are connected to a test function decoder 83. The output of the high voltage detection circuit 81 is connected to each of control inputs of the address buffer 84 and the output of the test control logic 82 is connected to each of control inputs of the test address latches 85.

A main operation is now described. When a high voltage is detected by the high voltage detection circuit 81, a code for specifying a test function applied to the address input terminals A3 to A6 is latched by the test address latches 85. The test function decoder 83 specifies one test out of tests 1 to 9 by decoding the code latched by the test address latches 85.

In the case of specifying a special mode in the conventional semiconductor memory device shown in FIG. 1, the number of special modes, or the number of different kinds of special modes permitted to be specified is limited by the number of external input terminals. In addition, since it is necessary to continue to apply the high voltage to the external terminals, a special mode to be related with a terminal whose voltage has been at the high level and should be changed to a low level can not be set.

Furthermore, in the case of specifying a test mode in the dynamic RAM shown in FIG. 3, the test mode which is being executed can not be confirmed during the execution of the test mode because the address buffers 84 outputting a signal in only one direction are used. As for an EEPROM, for example, it sometimes takes time to perform a rewritable process count evaluation test or a high temperature acceleration test under self testing. On the occasion of such test, it sometimes happens that a long time will have passed without noticing an erroneously set mode because there is no confirming the special mode which is being carried out during the test. Even if the special mode is set correctly, the setting could be changed due to various causes (such as unstable supply voltage, a mistake by an operator and the like) during the execution of the special mode.

SUMMARY OF THE INVENTION

It is an object of the invention to provide a method for testing an integrated circuit device using a large number of different functional tests.

Another object of the invention is to provide a method for testing an integrated circuit when continuously application of high voltage to the circuit is not required.

A further object of the invention is to provide a method for testing an integrated circuit in which its function to be tested can be confirmed during execution of the test.

A further object of the invention is to provide a method for testing a memory circuit using a large number of different functional tests.

A further object of the invention is to provide a method for testing a memory circuit when continuously application of high voltage to the circuit is not required.

A further object of the invention is to provide a method for testing a memory circuit in which its function to be tested can be confirmed during execution of the test.

A further object of the invention is to provide a method for on-chip testing an integrated circuit using a large number of different functional tests.

The integrated circuit to be tested in accordance with the present invention comprises detecting circuit for detecting at least a special signal and a confirmation signal applied to control inputs, respectively, to generate first and second detecting signals, switching circuit responsive to the first detecting signal for connecting, to latching circuit, an input/output to which data and a special code for specifying a special mode are applied, decoder circuit for decoding the special code latched by the latching circuit to specify one of special modes, and control circuit for executing the specified special mode. The input/output outputs the special code latched by the latching circuit in response to the second detecting signal.

In operation, the detecting circuit detects at least one special signal applied to one of the control inputs and generates the first detection signal. The switching circuit connects the input/output to the latching circuit in response to the first detection signal and a special code applied to the input/output is latched by the latching circuit. The decoder circuit decodes the special code latched by the latching circuit and the control circuit executes the special mode. Meanwhile, the detecting circuit detects the confirmation signal applied to another control input and generates the second detection signal. The switching circuit connects the latching circuit to the input/output in response to the second detection signal and the input/output outputs the special code, which has been latched by the latching circuit, in response to the second detection signal. The number of special modes allowed to be specified is increased because of the use of the special codes and a code of any special mode in execution can be confirmed because of the existence of the latching circuit connected to the decoder circuit.

According to the present invention, the integrated circuit has advantages that the number of the special modes allowed to be specified can be increased and a code of any special mode in execution can be confirmed.

In a preferred embodiment, the present invention is applied to a memory circuit. Therefore, the number of the special modes which can be specified for testing the memory circuit can be increased and the special modes, in which the test is being performed, can be confirmed.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
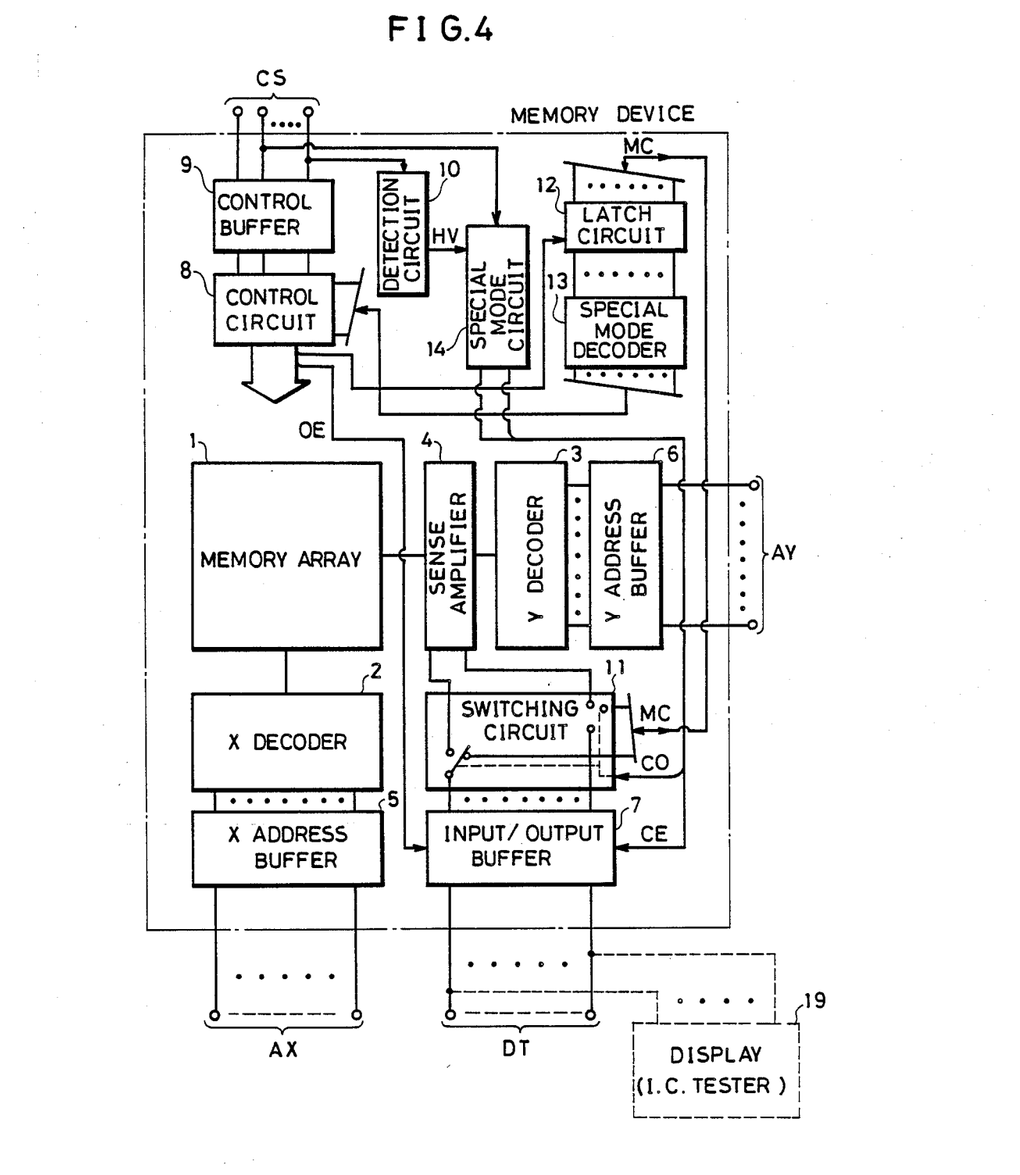
FIG. 4 is a block diagram showing a configuration of a semiconductor memory device of one embodiment of the present invention.

FIG. 4 is a block diagram showing a configuration of one embodiment of a semiconductor memory device in accordance with the present invention.

The configuration and function of the semiconductor memory device are different from those of the conventional semiconductor memory device shown in FIG. 1 as described below. One high voltage detection circuit 10 is provided on any one of control signal input/output terminals CS. When a high voltage is detected, a high voltage detection signal HV is applied to a special mode circuit 14. The special mode circuit 14 is connected to another one of the control input terminals CS to receive a confirmation signal CF. The special mode circuit 14 generates a switch signal CO and a check signal CE in response to the high voltage detection signal HV and the confirmation signal CF. A switching circuit 11 is connected to an input/output buffer 7 and is also connected to a sense amplifier 4 and a latch circuit 12. The latch circuit 12 is connected to a special mode decoder 13 and the special mode decoder 13 is connected to a control circuit 8. The switch signal CO generated from the special mode circuit 14 is applied to the switching circuit 11 and the check signal CE is applied to the input/output buffer 7. A reset signal PS is applied from the control circuit 8 for resetting the latch circuit 12.

Now operation of this embodiment is described.

In order to specify a special mode, a high voltage is applied to the control signal input terminals CS to which the high voltage detection circuit 10 is connected and a special mode code MC for specifying a mode out of plural special modes is applied to the input/output terminals DT. The high voltage detection circuit 10 detects the applied high voltage and applies the high voltage detection signal HV to the special mode circuit 14. The special mode circuit 14 applies the switch signal CO to the switching circuit 11 in response to this signal HD. The switching circuit 11 connects the input/output buffer 7 to the latch circuit 12 in response to the switch signal CO. Therefore, the special mode code MC applied to the input/output terminals DT is latched by the latch circuit 12. The special mode decoder 13 decodes the latched special mode code MC and applies a signal specifying a special mode to the control circuit 8. The control circuit 8 controls the execution of the special mode in response to this signal. After the special mode code MC is latched by the latch circuit 12, it is not necessary to apply the special mode code MC continuously. Thus, the execution of the special mode is not obstructed. More specifically, a special mode required to be executed with the input/output terminals DT being at a low level voltage, is not prevented from being performed.

Now a description is made of an operation to be performed when a special mode in execution is confirmed during the execution thereof.

The special mode circuit 14 applies the check signal CE to the input/output buffer 7 and the switch signal CO to the switching circuit 11 in response to a confirmation signal CF applied to one of the control signal input terminals CS. The switching circuit 11 connects the latch circuit 12 to the input/output buffer 7 in response to the switch signal CO. The input/output buffer 7 receives the special mode code MC latched in the latch circuit 12 through the switching circuit 11 to output the same on the input/output terminals DT in response to the check signal CE. The special mode code MC is displayed on a display 19 of an integrated circuit tester connected to the input/output terminals DT. Thus, the kind of the special mode in execution can be confirmed. As mentioned above, the special mode code MC applied from the input/output terminals DT can be outputted on the input/output terminals DT for confirmation of the special mode in execution, because the semiconductor memory device in accordance with the present invention shown in FIG. 4 uses the input/output buffer 7 having a bidirectional input/output function for a signal to input and output the special mode code MC and the special mode code MC can be latched by the latch circuit 12.

Referring to the embodiment in FIG. 4, although the high voltage detection circuit 10 is provided on one of the control signal input terminals CS, this may be provided on other terminals, that is, address input terminals AX or AY.

The conventional circuit shown in FIG. 2 may be used as the high voltage detection circuit 10.

Figure 5:
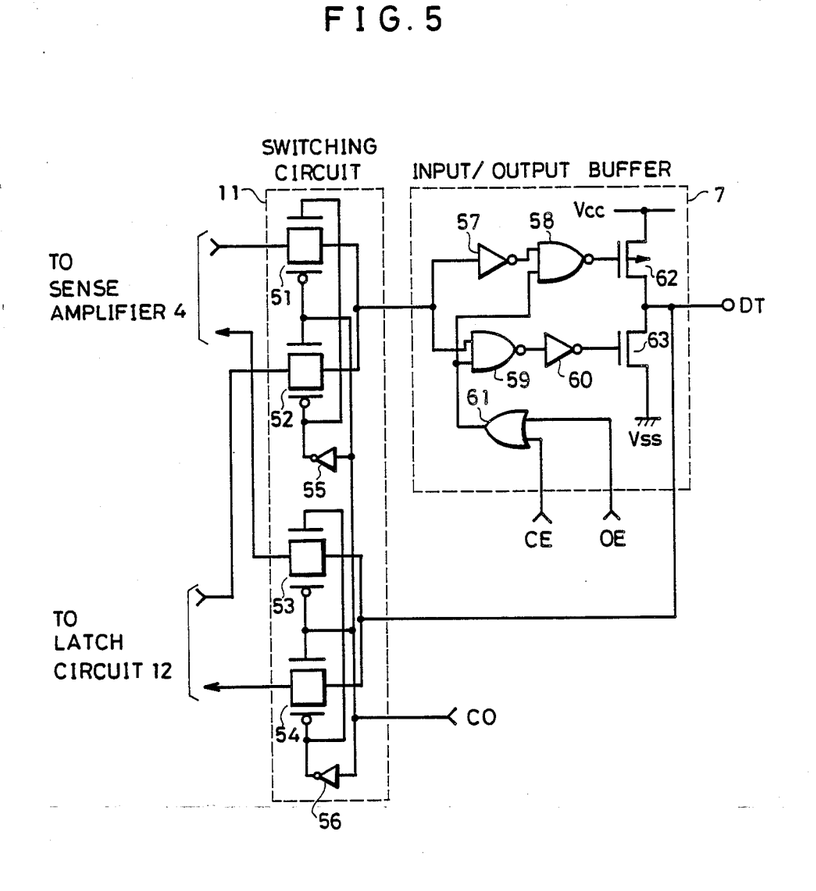
FIG. 5 is a schematic diagram showing an example of an input/output buffer and a switching circuit shown in FIG. 4.

FIG. 5 is a schematic diagram showing an example of a portion including the input/output buffer 7 and the switching circuit 11 shown in FIG. 4. The circuit shown in FIG. 5 including portions of the input/output buffer 7 and the switching circuit 11 corresponds to one of the input/output terminals DT and, in effect, a plurality of such circuits, the number of which is the same as that of the input/output terminals DT are provided.

Referring to FIG. 5, the input/output buffer 7 comprises a p channel MOS transistor 62 and an n channel MOS transistor 63, the connection point of which is connected to one of the input/output terminals DT, two NAND devices 58 and 59, two inverters 57 and 60, and an OR device 61. The switching circuit 11 comprises four CMOS transmission gates 51 to 54, and two inverters 55 and 56. Reference characters CO denote the switch signal, reference characters CE denote the check signal, and reference characters OE denote an output enable signal provided from the control circuit.

Next, concrete operation is described.

When the special mode code MC is applied to the latch circuit 12, the output enable signal OE is turned to the low level, the check signal CE is turned to the low level and the switch signal CO is turned to the high level. Then, the special code mode MC applied to the input/output terminals DT is applied to the latch circuit 12.

When the special mode code MC is outputted from the latch circuit 12, the output enable signal OE is turned to the low level, the check signal CE is turned to the high level and the switch signal CO is turned to the high level. Then, the special mode code MC is outputted from the latch circuit 12 to the input/output terminals DT.

In the case of a normal operation mode, the output enable signal OE is turned to the low level, the check signal CE is turned to the low level and the switch signal CO is turned to the low level when data is inputted, whereby data applied to the input/output terminals DT is applied to the sense amplifier 4. Further, the output enable signal OE is turned to the high level, the check signal CE is turned to the low level, and the switch signal CO is turned to the low level when data is outputted, whereby data is outputted from the sense amplifier 4 to the input/output terminals DT.

Figure 6:
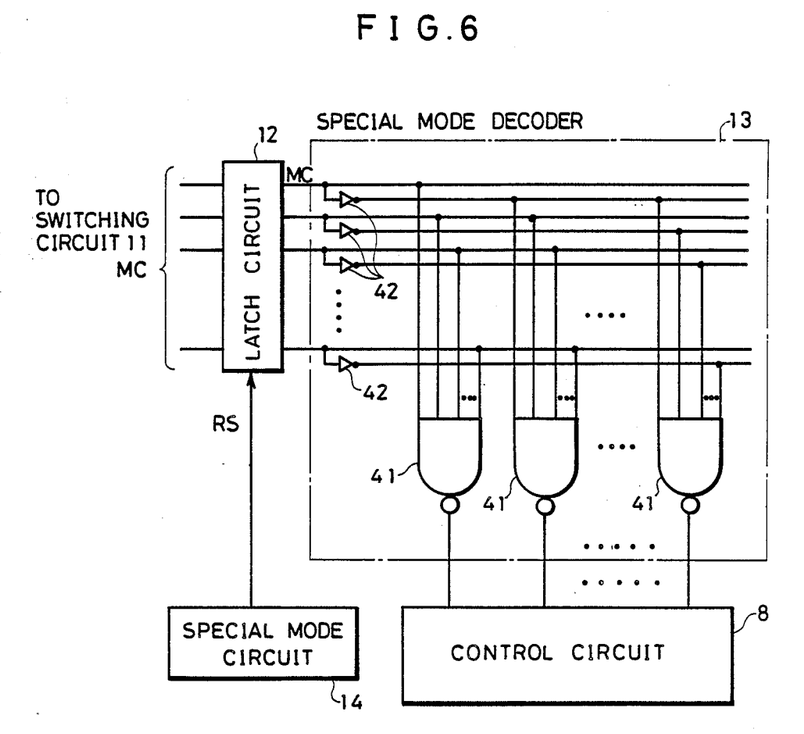
FIG. 6 is a schematic diagram showing an example of a special mode decoder shown in FIG. 4.

FIG. 6 is a circuit diagram showing an example of the special mode decoder 13 shown in FIG. 4.

Referring to FIG. 6, the special mode decoder 13 comprises a plurality of inverters 42 connected to the latch circuit 12 to receive a special mode code MC for each bit, and a plurality of NAND devices 41 connected to the input/output terminals of the inverters 42. By selectively connecting the respective input terminals of NAND devices 41 to the input/output terminals of the inverters 42, only a specified NAND device 41 outputs a low level signal for a specific special mode code MC. By confirming the NAND device 41 which has outputted a low level output signal, the control circuit 8 confirms the special mode specified by the special mode code MC to control the operation.

Figure 7:
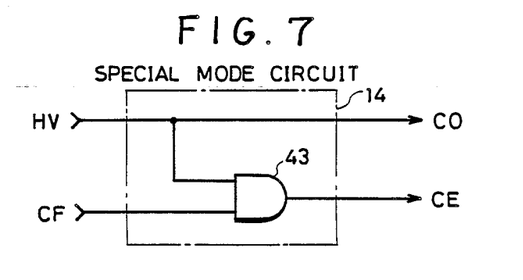
FIG. 7 is a circuit diagram showing one example of the special mode circuit shown in FIG. 4.

FIG. 7 is a circuit diagram showing an example of the special mode circuit 14 shown in FIG. 4.

Referring to FIG. 7, the special mode circuit 14 comprises an AND gate 43. The AND gate 43 has its one input connected so as to receive a high voltage detection signal HV and has its the other input connected so as to receive a confirmation signal. The AND gate 43 outputs a check signal CE. The high voltage detection signal HV is outputted from the circuit 14 as a switching signal CO.

In operation, when the high voltage detection signal HV on a high level and the confirmation signal CF on a low level are applied, the special mode circuit 14 outputs the switching signal CO on a high level and the check signal CE on a low level. In this case, as described above, the special mode code MC applied to the input/output terminals DT is applied to the latch circuit 12. On the other hand, the signals HV and CF, both of which are on a high level, are applied, the circuit 14 outputs the switching signal CO and the check signal CE, both of which are on a high level. In this case, as described above, the special mode code MC is outputted from the latch circuit 12 to the input/output terminals DT.

In a following Table 3, the level of each control signal described above are shown as a reference, corresponding to the operation of the semiconductor memory device. In the Table 3, "H" represents a high level and "L" represents a low level.

TABLE 3

| Mode | Signal | | | | |
|---|---|---|---|---|---|
| | OE | HV | CF | CE | CO |
| (Normal mode) | | | | | |
| Data input | L | L | L | L | L |
| Data output | H | L | H | L | L |
| (Special mode) | | | | | |
| Special code input | L | H | L | L | H |
| Special code output | L | H | H | H | H |

Figure 8A:
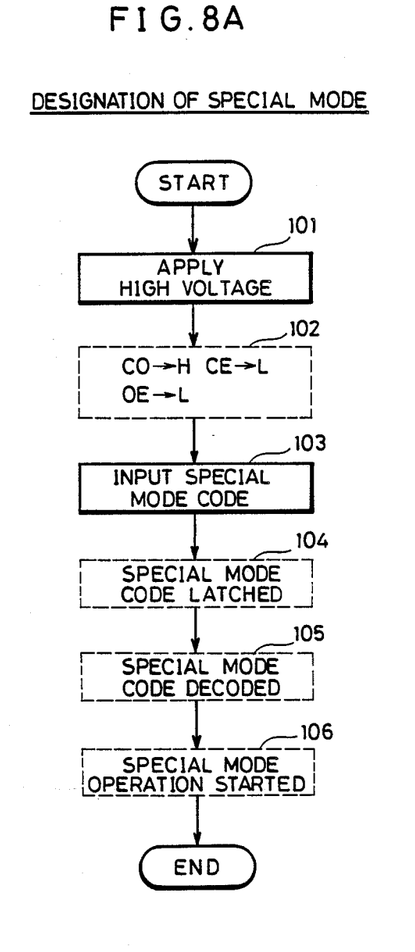
FIGS. 8A and 8B are flow charts showing approximate operational flow for specifying and confirming the special mode in the semiconductor memory device shown in FIG. 4.
Figure 8B:
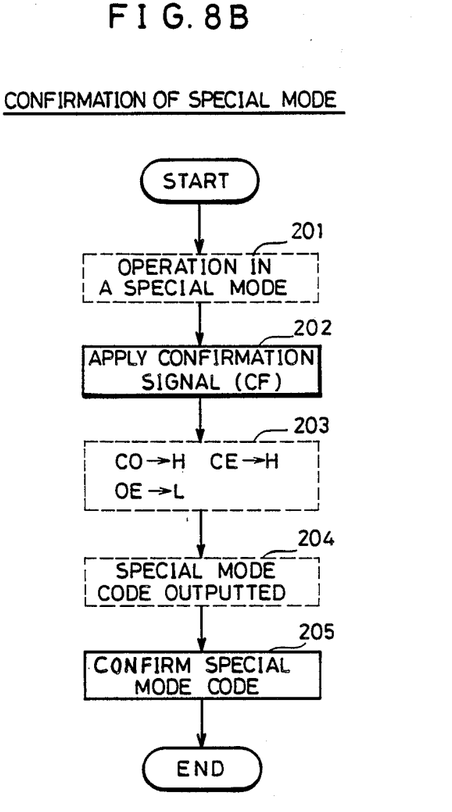

FIGS. 8A and 8B are flow charts showing approximate operational flow for specifying and confirming the special mode in the semiconductor memory device shown in FIG. 4. Referring to both figures, a step represented by a solid line shows external operation and a step represented by a dotted line shows operation in the semiconductor memory device.

Referring to FIG. 8A, at a step 101, a high voltage is applied from the outside to the control signal input terminal CS connected to the high voltage detecting circuit 10. At a step 102, the switch signal CO changes to a high level in response to the high voltage, while the check signal CE and the output enable signal OE are on a low level. At a step 103, the special mode code MC is inputted from the outside through the input/output terminals DT. At a step 104, the special mode code MC is latched by the latch circuit 12. At a step 105, the special mode code MC is decoded by the decoder 13. At a step 106, the operation in the special mode is started. Specification of the special modes is completed by those aforementioned steps.

Referring to FIG. 8B, let is be assumed that this semiconductor memory device is in operation in a certain special mode (step 201). At a step 202, the confirmation signal CF is applied from the outside through one of the predetermined control signal input terminals CS. At a step 203, the switch signal CO and the check signal CE change together to a high level in response to the confirmation signal CF. On the other hand, the output enable signal OE is on a low level. At a step 204, the special mode code MC latched by the latch circuit 12 is outputted to the outside. At a step 205, by confirming the special mode code MC, the special mode in operation can be found.

Although the aforementioned description is made in a case where the present invention is applied to a semiconductor memory device, the present invention is generally applicable to input/output means which can input/output a data signal in both directions, for example, an integrated circuit having a buffer circuit.

As described above, in accordance with the present invention, the latching means latches the special code by detecting the special signal, the decoder means decodes the latched special code to apply a signal of the decoded special code to the controlling means, and the special code latched by the latching means is outputted from the input/output terminals by detecting the confirmation signal. Therefore, by use of the decoder means, the number of the special modes capable of being specified by the special codes is increased, and there is no necessity to continuously apply the special signal and the special mode through by the latching means. In addition, the special mode can be confirmed during the execution thereof.

Although the present invention has been described and illustrated in detail, it is clearly understood that the same is by way of illustration and example only and is not to be taken by way of limitation, the spirit and scope of the present invention being limited only by the terms of the appended claims. input/output a data signal in both directions, for example, an integrated circuit having a buffer circuit.

As described above, in accordance with the present invention, the latching means latches the special code by detecting the special signal, the decoder means decodes the latched special code to apply a signal of the decoded special code to the controlling means, and the special code latched by the latching means is outputted from the input/output terminals by detecting the confirmation signal. Therefore, by use of the decoder means, the number of the special modes capable of being specified by the special codes is increased, and there is no necessity to continuously apply the special signal and the special mode through by the latching means. In addition, the special mode can be confirmed during the execution thereof.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An integrated circuit to be tested comprising:
   an input/output means for inputting and outputting data and a special code to specify any of a plurality of special modes for testing said integrated circuit to be tested;
   a control input means for receiving a control signal, a special signal and a confirmation signal;
   detecting means connected to said control input means for detecting said special signal and said confirmation signal applied to said control input means and generating a first detection signal and a second detection signal;
   switching means connected to said input/output means latching means connected to said switching means for latching the special code from said input/output means through said switching means,
   said switching means electrically connecting said input/output means to said latching means in response to the first or the second detection signal;
   decoder means connected to said latching means for decoding the special code latched by said latching means and specifying one of said special modes; and
   controlling means for executing the special mode specified by said decoder means,
   wherein said input/output means receives the special code latched by said latching means in response to the second detection signal through said switching means and outputs the same to external data lines coupled to said input/output means.

2. An integrated circuit in accordance with claim 1, wherein said special signal includes a high voltage signal and said detecting means comprises high voltage detecting means.

3. An integrated circuit in accordance with claim 1, wherein said circuit to be tested comprises a semiconductor memory device and said control input means comprises an address signal input and a control signal input of said semiconductor memory device.

4. A method for operating an integrated circuit, said integrated circuit to be tested comprising:
   an input/output means for inputting an outputting data and a special code to specify any of a plurality of special modes for testing said integrated circuit to be tested;
   a control input means for receiving a control signal, a special signal and a confirmation signal;
   detecting means connected to said control input means for detecting said special signal and said confirmation signal applied to said control input means and generating a first detection signal and a second detection signal;
   switching means connected to said input/output;
   latching means connected to said switching means for latching the special code from said input/output means through said switching means,
   said switching means electrically connecting said input/output means to said latching means in response to the first or the second detection signal;
   decoder means connected to said latching means for decoding the special code latched by said latching means and specifying one of said special modes; and
   controlling means for executing the special mode specified by said decoder means,
   wherein said input/output means receives the special code latched by said latching means in response to the second detection signal through said switching means and outputs the same to external data lines,
   said method comprising:
   a step of applying a special signal to said detecting means through said control input means;
   a step of applying a confirmation signal to said detecting means through said control input means; and
   a step of confirming the special code latched by said latching means at the outside through said input/output means.

5. A method in accordance with claim 4, wherein said integrated circuit comprises a semiconductor memory device.

6. A method in accordance with claim 5, wherein said control input means comprises an address signal input and a control signal input of said semiconductor memory device.

7. A method in accordance with claim 4, wherein said special signal is a high voltage signal and said detecting means comprises high voltage detecting means.

8. A semiconductor memory device comprising:
   a memory array including a plurality of memory cells and means for addressing said plurality of memory cells in said memory array;
   an input/output buffer coupled to a plurality of external data lines and a plurality of control input lines;
   a detection circuit coupled to at least one of said control input lines, wherein said detection circuit detects the presence of a special signal and a confirmation signal applied to said control lines and respectively generates a first detection signal and a second detection signal;
   a switching circuit coupled to said input/output buffer and a latching circuit, wherein said switching circuit electrically connects said input/output buffer to said latching circuit in response to at least one of said first and second detection signals generated by said detection circuit to thereby latch a special code supplied to said input/output buffer via said external data lines;

a decoder circuit coupled to said latching circuit and a control circuit coupled to said decoder circuit, wherein said decoder circuit decodes the special code latched by said latching circuit and said control means is responsive to the output of said de-
coder circuit to execute a special mode specified by said special code; and wherein said input/output buffer transfers said special code to said external data lines in response to said second detecting signal generated by said detecting circuit.

* * * * *